United States Patent
Han et al.

(10) Patent No.: US 7,118,975 B2
(45) Date of Patent: Oct. 10, 2006

(54) METHOD FOR MANUFACTURING A SEMICONDUCTOR DEVICE

(75) Inventors: Jae-Jong Han, Seoul (KR); Young-Wook Park, Suwon-si (KR); Jae-Hyun Yeo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 186 days.

(21) Appl. No.: 10/872,360

(22) Filed: Jun. 22, 2004

(65) Prior Publication Data
US 2004/0266118 A1  Dec. 30, 2004

(30) Foreign Application Priority Data
Jun. 26, 2003  (KR) .................. 10-2003-0042242

(51) Int. Cl.
*H01L 21/336* (2006.01)
(52) U.S. Cl. ...................... 438/296; 438/589
(58) Field of Classification Search ............ 438/282, 438/296, 589, 978
See application file for complete search history.

(56) References Cited

U.S. PATENT DOCUMENTS 5,723,376 A    3/1998   Takeuchi et al.
6,222,225 B1 * 4/2001   Nakamura et al. .......... 257/315
6,448,139 B1   9/2002   Ito et al.
6,548,374 B1 * 4/2003   Chung ........................ 438/424

FOREIGN PATENT DOCUMENTS

KR      1998-065787       10/1998

* cited by examiner

*Primary Examiner*—Chandra Chaudhari
(74) *Attorney, Agent, or Firm*—Harness, Dickey & Pierce, P.L.C.

(57) ABSTRACT

Provided is a method for manufacturing semiconductor devices including channel trenches that are separated by isolation structures. According to the process, the substrate is etched to form isolation trenches after which a sidewall oxide layer, a liner nitride layer and a field oxide layer are subsequently formed on the substrate and in the isolation trenches. The substrate is then planarized to remove upper portions of the sidewall oxide layer, the liner nitride layer and the field oxide layer to expose surface portions of the substrate between adjacent isolation trench structures. Channel trenches are then formed in the exposed surface portions of the substrate leaving residual substrate regions adjacent the isolation trench structures. These residual substrate regions are then oxidized and removed to form improved second channel trenches for the formation of transistor regions.

16 Claims, 10 Drawing Sheets

METHOD FOR MANUFACTURING A SEMICONDUCTOR DEVICE

CROSS REFERENCE TO RELATED APPLICATION

This application claims priority under 35 U.S.C. § 119 from Korean Patent Application No. 2003-42242, which was filed on Jun. 26, 2003, the contents of which are herein incorporated by reference in their entirety for all purposes.

BACKGROUND OF THE INVENTION

1. Field of the Invention

The present invention relates to a method for manufacturing semiconductor devices and, more particularly, to a method for manufacturing semiconductor devices incorporating a transistor having a trench type channel.

2. Description of the Related Art

As the use of semiconductor memory devices has continued to expand in computers, telecommunications equipment and personal electronics, the demand for improved semiconductor memory devices has remained strong. From a functional point of view, preferred semiconductor memory devices will tend to be those that are reliable, capable of operating a high speed and simultaneously provide a large data storage capacity.

In order to meet these demands, the fabrication technology employed in manufacturing semiconductor memory devices has tended to focus on improving the degree of integration, the reliability and the operating speed of semiconductor memory devices. As the degree of integration increases, the surface area available for forming the individual memory cells decreases. As the cell size is reduced, the dimensions of the structural elements and patterns formed on the substrate, as well as the manufacturing process margins associated with such elements and patterns, has also been reduced.

As a result, the channel length of a cell memory cell transistor decreased to a point where leakage current presented a concern with regard to the memory cell transistor performance and reliability. In order to suppress or reduce the leakage current, various methods for lengthening the effective channel length have been proposed and utilized. One such method utilizes a trench type gate electrode in the cell transistor rather than a conventional planar type gate electrode.

FIGS. 1–5 are cross-sectional views illustrating a conventional method of manufacturing a semiconductor device having a trench type channel. Referring to FIG. 1, a pad oxide layer (not shown) is formed on a substrate 100 with a mask layer (not shown) then being formed on the pad oxide layer. The mask layer is subsequently patterned using any conventional photolithography process to form a mask pattern (not shown) that exposes portions of the pad oxide layer. The exposed portions of the pad oxide layer and the underlying substrate 100 are then etched using the mask pattern as an etching mask to form isolation trenches having an upper width greater than a lower width.

An oxide layer (not shown) is then formed on the substrate 100 and the isolation trenches with a nitride layer (not shown) then being formed on the oxide layer. A thicker insulating layer (not shown) is then formed on the nitride layer to a thickness sufficient to fill the isolation trenches. Upper portions of the insulating layer, the nitride layer and the oxide layer are then removed to planarize the surface and expose regions of the substrate 100 between isolation trench structures 140 that include an oxide layer pattern 110, a liner nitride layer pattern 120 and an insulating layer pattern 130. The isolation trench structures 140 will tend to exhibit an upper width greater than a lower width generally corresponding to the shape of the isolation trench. An active region A may be defined in a portion of the substrate 100 arranged between adjacent isolation trench structures 140.

Referring to FIG. 2, a first channel trench 150 is then formed by removing an upper portion of the substrate 100 from the active region A using a highly anisotropic etch. Conventionally, a mask pattern (not shown) will be formed on the substrate 100 to expose only a portion of the substrate in the active region. The exposed substrate 100 is then etched using the mask pattern as an etching mask to form the first channel trench 150 in the active region A.

Because the isolation trench structures 140 tend to have an upper width that is greater than their lower width, a residual portion 100a of the substrate 100 will tend to remain in region B adjacent the isolation trench structures 140 after formation of the first channel trench 150. Because the remaining portion 100a of the substrate can interfere with the subsequent formation of a memory cell transistor, allowing the remaining portion to remain in place will tend to degrade the electrical function and reliability of the resulting memory cell transistor. Accordingly, it is desirable to remove the residual portion 100a of the substrate 100 from the peripheral regions of the first channel trench 150.

Referring to FIG. 3, the remaining portion 100a of the substrate 100 may be removed using a secondary dry etch to form a second channel trench 160. However, although the conventional secondary dry etch tends to remove the majority of the residual portion 100a, a second residual tip portion 100b will tend to be formed along the periphery of the channel trench adjacent the isolation trench structures in region C. The tip portion 100b of the substrate 100 may weaken or degrade a gate oxide layer formed in the channel trench during a subsequent process.

Referring to FIG. 4, a sacrificial oxide layer (not shown) is formed on the substrate 100 and the isolation trench structures 140. The sacrificial oxide layer and a portion of the isolation trench structures 146, specifically an upper portion of the oxide layer 110, are then removed to form a third channel trench 170. The sacrificial oxide layer provides some protection for the upper surface of the isolation trench structures 140 during the etch process. Referring to FIG. 5, a gate oxide layer 180 is then formed on the exposed surfaces of substrate 100 and a gate electrode 190 is formed on the gate oxide layer 180 and the isolation trench structures 140.

However, in the conventional fabrication method, the residual portion 100a of the substrate 100 must be removed using a secondary etch process and typically a second dry etch apparatus, thus requiring an additional etch step for the formation of the channel trench.

Further, because the secondary etch process does not tend to remove all of the residual portion 100a of the substrate 100 not completely removed using the conventional secondary etch method, a smaller residual tip 100b of the substrate will tend to remain along the periphery of the channel trench. This residual tip 100b, if left in place, will tend to compromise or degrade the subsequently formed gate oxide layer 180 to a degree that lowers the performance and/or reliability of resulting memory cell transistor.

SUMMARY OF THE INVENTION

The exemplary embodiments of the present invention provide methods of manufacturing a semiconductor device in a manner that may reduce or suppress formation of residual tips of the substrate along the periphery of the channel trench.

In accordance with a first exemplary embodiment of the present invention, there is provided a method of manufacturing a semiconductor device in which isolation trench structures are formed in a substrate, a channel trench is formed by removing an upper portion of the substrate between adjacent isolation trench structures. Residual portions of the substrate adjacent the isolation trench structures are oxidized substantially completely to form an oxide layer that is then removed. The oxide layer may be formed using oxygen ($H_2O$), water vapor ($H_2O$) and hydrogen chloride (HCl) in an oxygen reactor at a temperature of about 800° C. to about 900° C. and removed using a wet etching process. The substrate may be cleaned using an SC1 solution (typically a 5:1:1 mixture of $H_2O:NH_4OH:H_2O_2$) or a hydrogen fluoride (HF) solution.

In accordance with another exemplary embodiment of the present invention, there is provided a method of manufacturing a semiconductor device in which a substrate is etched to form isolation trenches, a sidewall oxide layer, a liner nitride layer and a field oxide layer are subsequently formed on the substrate and in the isolation trenches. Upper portions of the sidewall oxide layer, the liner nitride layer and the field oxide layer are then removed to form a substantially planar surface that exposes portions of a surface of the substrate separated by isolation trench structures. A channel trench is then formed by removing an upper portion of the substrate between adjacent isolation trench structures with residual side portions of the substrate remaining adjacent the isolation trench structures being oxidized and then removed prior to forming a gate oxide layer and a gate electrode. The oxide layer may be formed using oxygen ($O_2$), water vapor ($H_2O$) and hydrogen chloride (HCl) in an oxygen reactor operating at a temperature of between about 800° C. to about 900° C. and then removed using a wet etching process. The substrate may then be cleaned using an SC1 solution or an aqueous hydrogen fluoride (HF) solution.

According to the exemplary embodiments of the present invention, any portion of the substrate remaining adjacent the isolation trench structure along the periphery of the channel trench will be substantially oxidized to form an oxide layer that will be subsequently removed using a wet etching process. The exemplary methods according to the present invention will, therefore, tend to reduce or eliminate any residual tips or portions of the substrate that may be formed during the channel trench etch. Accordingly, the exemplary methods can provide channel trenches having improved profiles that will tend to improve the quality of the subsequent gate oxide layer and, consequently, tend to improve the performance and/or reliability of the resulting semiconductor device.

BRIEF DESCRIPTION OF THE DRAWINGS

The features and advantages of the invention will become more readily apparent by reference to the following detailed description when considered in conjunction with the accompanying drawings wherein.

Figure 1:
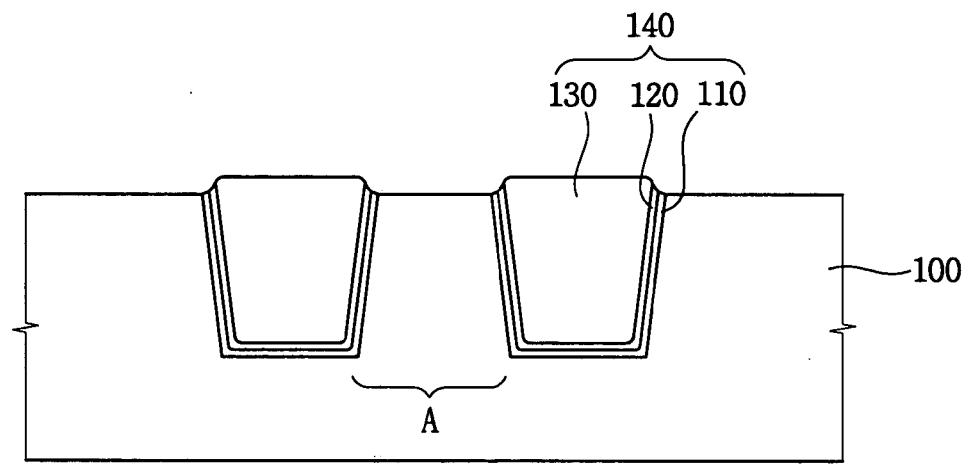
FIGS. 1 to 5 are cross sectional views illustrating a conventional method of manufacturing a semiconductor device having a trench type channel.
Figure 2:
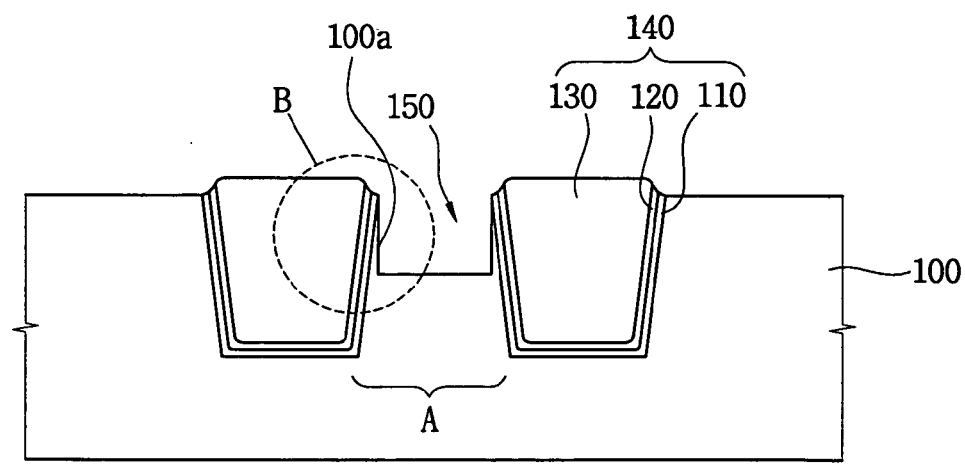
Figure 3:
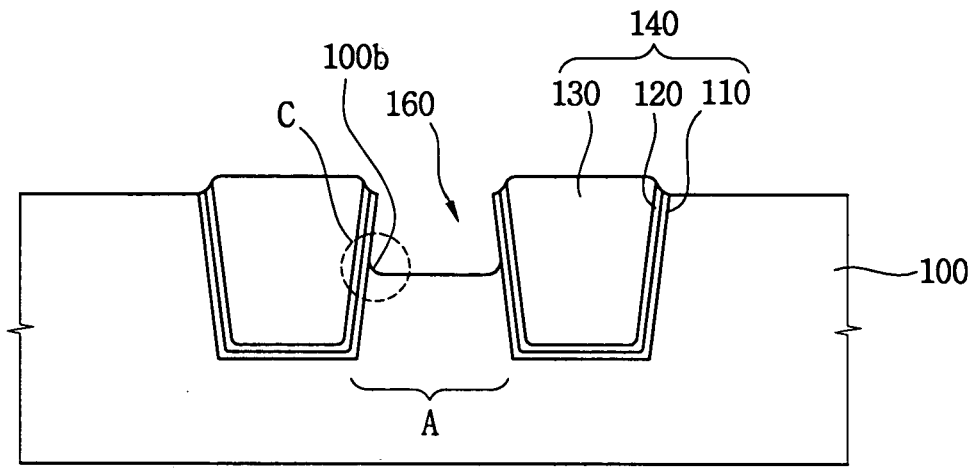
Figure 4:
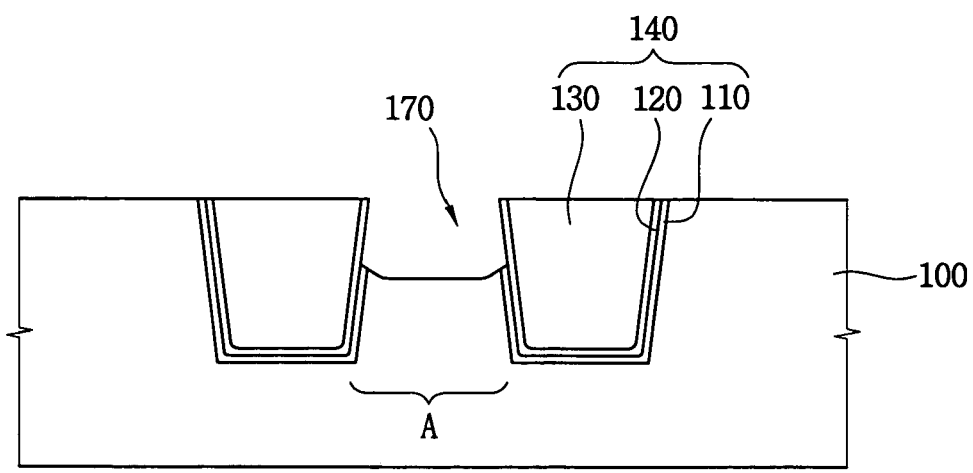
Figure 5:
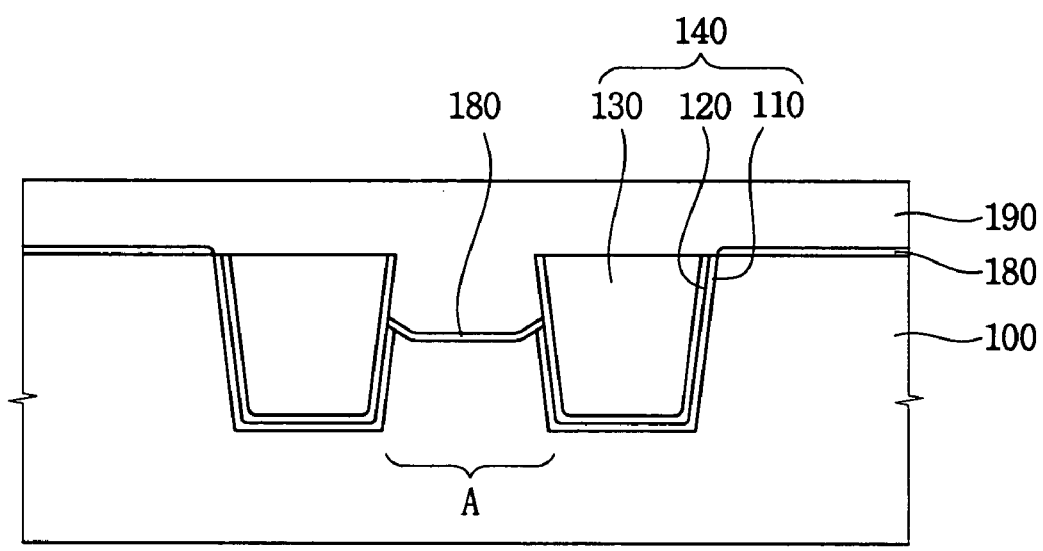

In the drawings, it should be understood that the thicknesses and relative positioning and sizing of the illustrated layers, elements and regions are not drawn to scale and may have been enlarged, reduced, simplified or otherwise modified for improved clarity. Also, throughout the drawings, similar or identical reference numerals are used to refer to similar, corresponding or identical elements.

DESCRIPTION OF THE EXEMPLARY EMBODIMENTS

The present invention now will be described more fully hereinafter with reference to the accompanying drawings, in which exemplary embodiments of the present invention are shown. This invention may, however, be embodied in many different forms and should not be construed as limited to the specific embodiments set forth herein, but it should be recognized that these exemplary embodiments are provided so that this disclosure will be thorough and complete, and will fully convey the scope of the invention to those skilled in the art. It should be understood that as used herein, when an element such as a layer, region or substrate is described as being "on" or deposited "onto" another element, such language does not preclude the presence of one or more intervening elements.

FIGS. 6 to 9 are cross sectional views illustrating an exemplary method of manufacturing a semiconductor device in accordance with a first embodiment of the present invention.

Figure 6:
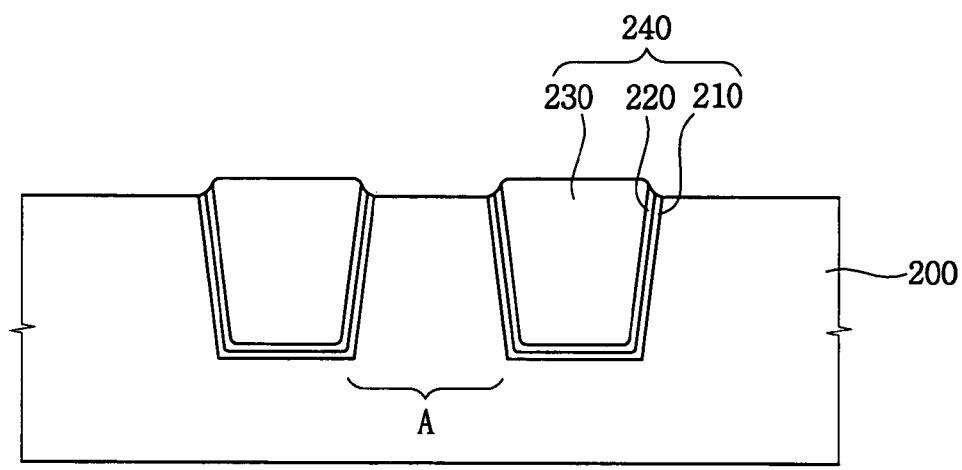
FIGS. 6 to 9 are cross sectional views illustrating a method of manufacturing a semiconductor device in accordance with a first exemplary embodiment of the present invention.

Referring to FIG. 6, a pad oxide layer (not shown) is formed on a substrate 200. A mask layer (not shown) is formed on the pad oxide layer using a material that has a relatively high, e.g., at least 25:1, etching selectivity relative to the substrate 200. For example, the mask layer may include a silicon nitride layer.

The mask layer may then be patterned using a photolithography process to form a mask pattern (not shown) that exposes regions of the surface of the substrate 200. The substrate 200 is etched using the mask pattern as an etching mask to form isolation trenches that can have depths on the order of about 5,000 Å to about 10,000 Å. The mask pattern is then removed from the substrate 200.

An oxide layer (not shown) is formed on the substrate 200, and sidewalls and bottom faces of the isolation trenches. liner nitride layer (not shown) is formed on the oxide layer. An insulating layer (not shown) is then formed on the liner nitride layer to a thickness sufficient to fill the isolation trenches. The combination of the oxide layer and the liner nitride layer may suppress stresses generated due to differences between the coefficients of thermal expansion (CTE) of the insulation layer and the substrate 200 and may also prevent the movement of contaminants from the insulating layer to the substrate.

Upper portions of the insulating layer, the liner nitride layer and the oxide layer may then be removed with a chemical mechanical polishing (CMP) process or an etch back process to form a substantially planar surface on which regions of the surface of the substrate 200 are exposed between form isolation trench structures 240. The isolation trench structures 240 may include a sidewall oxide layer pattern 210, a liner nitride layer pattern 220 and an insulating layer pattern 230 and have surfaces that protrude from the substrate 200. Accordingly, an active region A is defined in an upper portion of the substrate 200 between the isolation trench structures 240.

Figure 7:
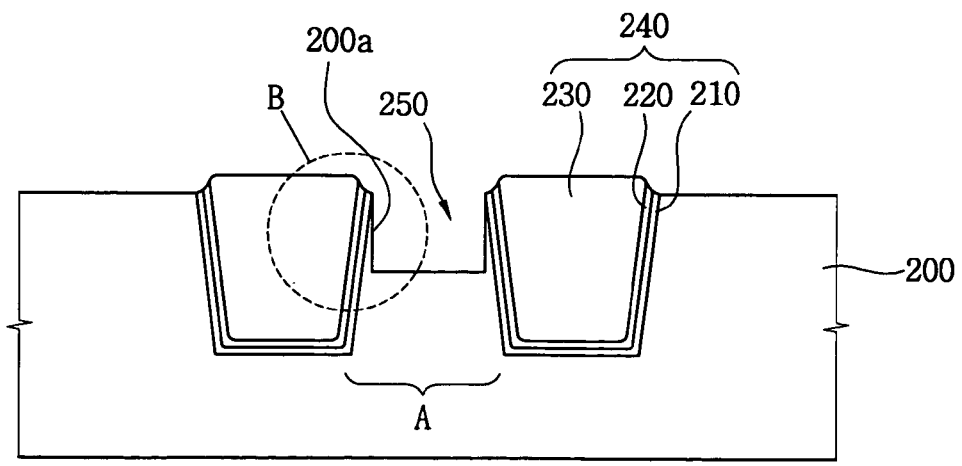

Referring to FIG. 7, a first channel trench 250 is formed in an upper portion of the substrate 200 between the isolation trench structures 240. In particular, a pad oxide layer (not shown) is formed on the isolation trench structures 240 and the substrate 200. A mask layer (not shown) is formed on the pad oxide layer. The mask layer material may be selected to provide an etching selectivity substantially identical to the substrate 200. For example, the mask layer may include a polysilicon layer and may have a thickness of about 1,500 Å. The mask layer is then etched to form a mask pattern (not shown) that exposes the surface of the substrate 200 in the active region A. The exposed surface of the substrate 200 is then etched to form the first channel trench 250 that may have a depth of about 1,500 Å. During the formation of the first channel trench 250, a side portion 200a of the substrate 200 will tend to be formed adjacent the isolation trench structures 240 along the periphery of the first channel trench 250 in region B.

Figure 8:
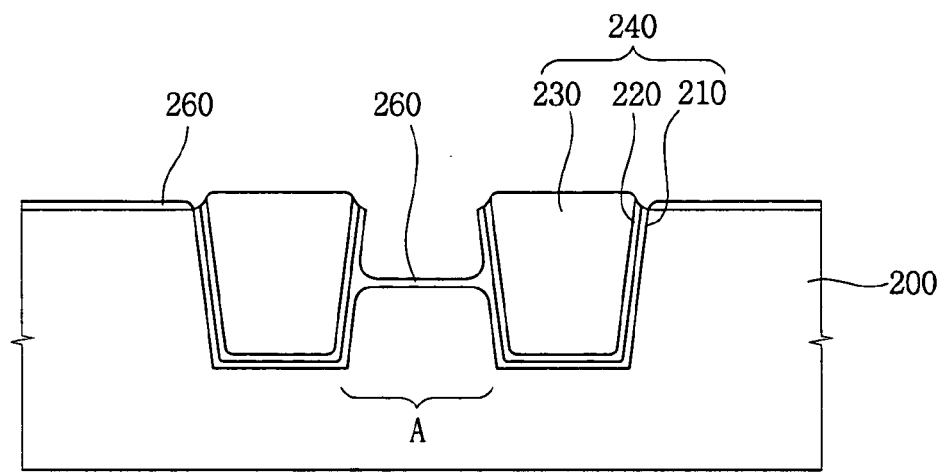

Referring to FIG. 8, the exposed surface of the substrate 200 is then oxidized to form an oxide layer 260. In particular, the substrate 200 may be loaded into a furnace (not shown) for performing an oxidation reaction. A gas including a mixture of oxygen (O2), water vapor (H2O) and hydrogen chloride (HCl) is then applied to the substrate 200 at a temperature of about 800° C. to about 900° C. to form an oxidizing atmosphere in the furnace and form the oxide layer 260 on the substrate 200. Here, the remaining side portion 200a of the substrate 200 is oxidized to become a part of the oxide layer 260.

Figure 9:
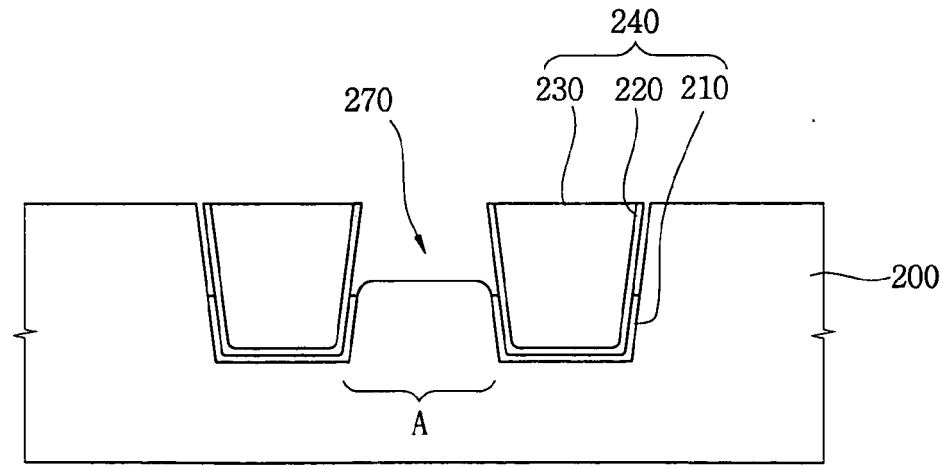

Referring to FIG. 9, the oxide layer 260 is then removed by a wet etching process using an etching solution using, for example a buffered HF oxide etchant, to form a second channel trench 270. Simultaneously, side portions and upper portions of the sidewall oxide layer pattern 210 are partially removed and also upper portions of the insulating layer pattern 230 are partially removed. Accordingly, the uppermost portions of the sidewall oxide layer pattern 210 are recessed relative to the surface of the substrate 200 exposed in the second channel trench 270. Here, when the oxide layer 260 is entirely removed, no portion of the substrate 200 remains adjacent the isolation trench structures 240 along the periphery of the second channel trench 270. As a result, no tip structure is formed on the substrate 200 in the second channel trench 270. Additionally, the substrate 200 may be cleaned using an SC1 solution or a hydrogen fluoride (HF) solution.

FIGS. 10 to 16 are cross sectional views illustrating a method of manufacturing a semiconductor device in accordance with a second exemplary embodiment of the present invention.

Figure 10:
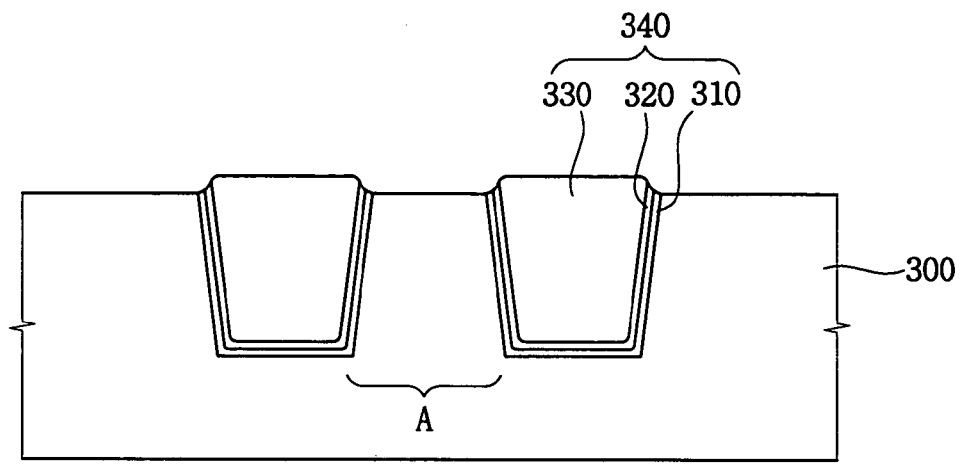
FIGS. 10 to 16 are cross sectional views illustrating a method of manufacturing a semiconductor device in accordance with a second exemplary embodiment of the present invention.

Referring to FIG. 10, a pad oxide layer (not shown) is formed on a substrate 300. A mask layer (not shown) is formed on the pad oxide layer with the mask layer material being selected to provide a high etching selectivity relative to a substrate 300. For example, the mask layer may include a silicon nitride layer having a thickness of about 500 Å to about 2,500 Å.

The mask layer may be patterned using a photolithography process to form a mask pattern (not shown) that partially exposes the substrate 300. The exposed portions of substrate 300 are then etched using the mask pattern as an etching mask to form isolation trenches. The isolation trenches may have a depth of about 5,000 Å to about 10,000 Å and have a lower width and an upper width that is greater than the lower width with sidewalls forming an angle of about 87° relative to the surface of the substrate 300. The mask pattern is then removed from the substrate 300.

An oxide layer (not shown) having a thickness of about 120 Å is formed on the substrate 300 including the exposed sidewalls and bottom faces of the isolation trenches. A liner nitride layer (not shown) having a thickness of about 40 Å to about 60 Å may then be formed on the oxide layer with a low pressure chemical vapor deposition (LPCVD) process. An insulating layer (not shown) is formed on the liner nitride layer to a thickness sufficient to fill the isolation trenches. The insulating layer may include a material having good gap filling characteristics including, for example, undoped silicate glass (USG), spin on glass (SOG), phospho silicate glass (PSG), or borophospho silicate glass (BPSG).

The oxide layer and the liner nitride layer may act to suppress stresses generated due to a difference between the coefficients of thermal expansion (CTE) between the insulation layer and the substrate 300, and may also prevent or retard the spread of contaminants from the insulating layer to the substrate. The upper portions of the insulating layer, the liner nitride layer and the oxide layer are then removed by a chemical mechanical polishing (CMP) process or an etch back process to expose the surface of the substrate 300 and form isolation trench structures 340 including a sidewall oxide layer pattern 310, a liner nitride layer pattern 320 and an insulating layer pattern 330. The isolation trench structures 340 will typically have surfaces protruding from the substrate 300. Active regions A will be defined in portions of the substrate 300 which lie between adjacent isolation trench structures 340.

Figure 11:
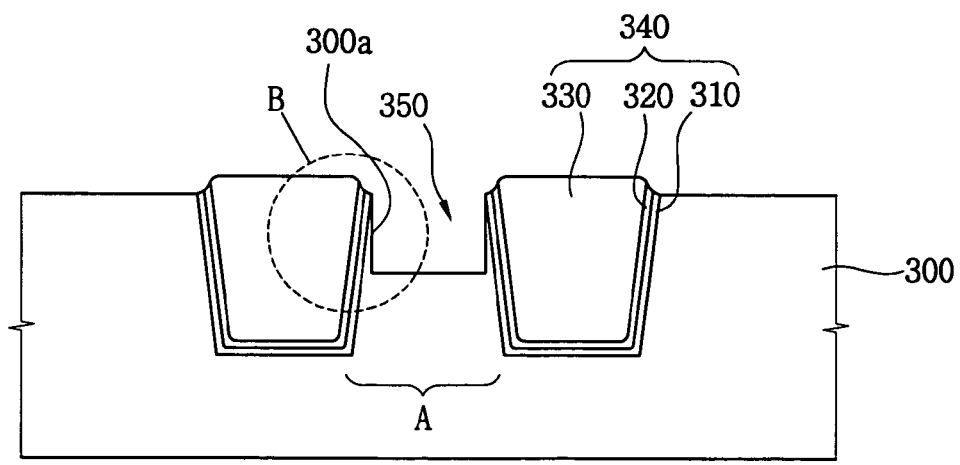

Referring to FIG. 11, a first channel trench 350 is formed by removing an upper portion of the substrate 300 between the isolation trench structures 340. In particular, a pad oxide layer (not shown) is formed on the isolation trench structures 340 and the substrate 300. A mask layer (not shown) is formed on the pad oxide layer.

The mask layer may have an etching selectivity substantially identical to the substrate 300. For example, the mask layer may include a polysilicon layer having a thickness of about 1,500 Å. The polysilicon layer is patterned to form a mask pattern (not shown) exposing the surface of the substrate 300 in the active region A. The exposed surface of the substrate 300 is then etched to form the first channel trench 350 which may have a depth of about 1,500 Å. After the first channel trench 350 is formed, a side portion 300a of the substrate 300 will typically remain adjacent the isolation trench structures 340 along the peripheral of first channel trench 350 in region B. Since the remaining side portion 300a of the substrate 300 may function as an electrical channel, the remaining side portion has to be removed to improve the function and uniformity of the final channel region.

Figure 12:
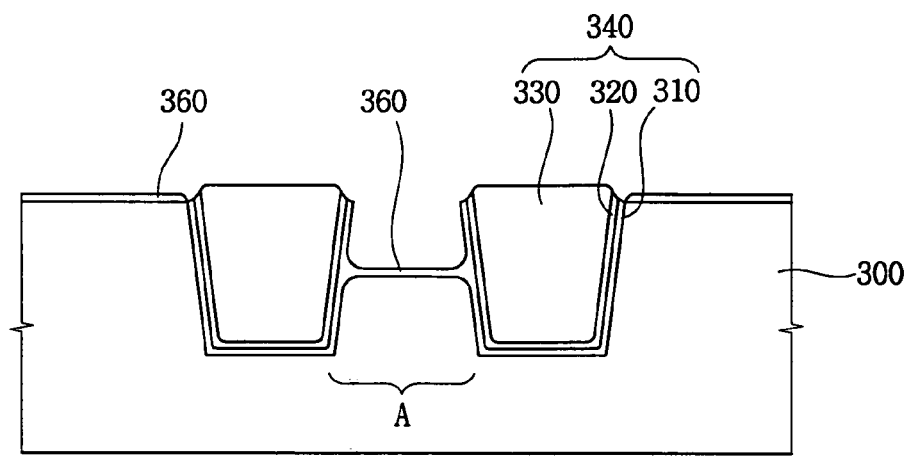

Referring to FIG. 12, the exposed surface of the substrate 300 is oxidized to form an oxide layer 360. In particular, the substrate 300 may be loaded into a furnace (not shown) for performing an oxidation reaction. A gas mixture including oxygen (O2), water vapor (H2O) and hydrogen chloride (HCl) may be applied to the substrate 300 at a temperature of about 800° C. to about 900° C. to form an oxidizing atmosphere in the furnace to produce the oxide layer 360.

The remaining side portion 300a of the substrate 300 will be consumed and form a part of the oxide layer 360.

Figure 13:
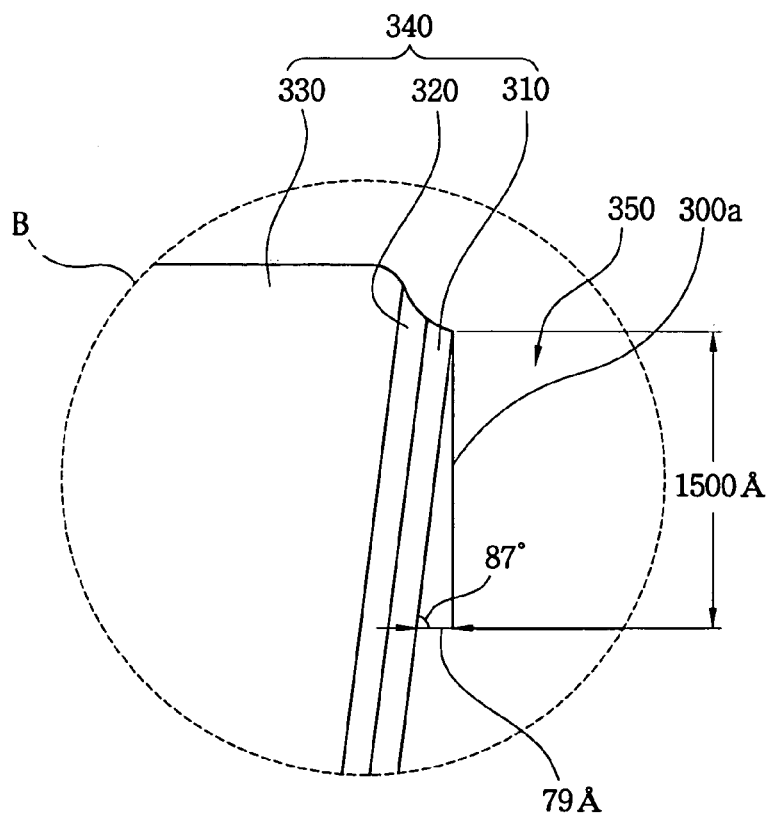

As illustrated in FIG. 13, which is an enlarged B portion of FIG. 11, the side face of the isolation trench structures 340 is inclined at an angle of about 87° relative to the surface of the substrate and the depth of the channel trench is about 1,500 Å. Therefore, a theoretical maximum thickness of the side portion 300a is about 79 Å obtained by dividing 1,500 Å by tan 87°. However, considering inaccurately formed slopes of the isolation trench and the channel trench, the maximum thickness of the side portion 300a may be as much as 150 Å resulting in a maximum oxide of about 300 Å.

Figure 14:
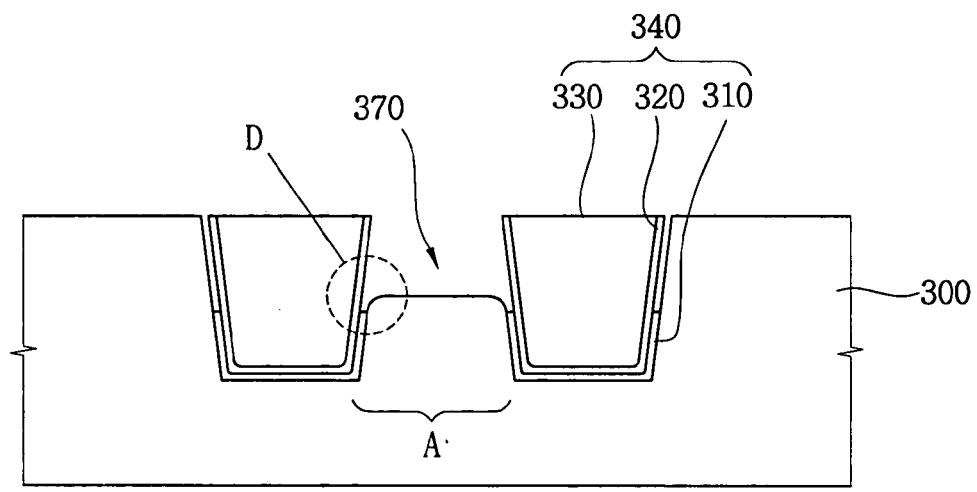

Referring to FIG. 14, the oxide layer 360 is then removed using a wet etching process using an etching solution, for example a buffered HF oxide etchant, to form a second channel trench 370. Simultaneously, upper portions and side portions of the sidewall oxide layer pattern 310 are partially removed and also upper portions of the insulating layer pattern 330 are removed. Accordingly, the side portions of the oxide layer 310 are recessed relative to the surface of the substrate 300 in the second channel trench 370. When the oxide layer 360 is entirely removed, no portion of the substrate 300 remains along the isolation trench structures 340 at the periphery second channel trench 370. As a result, the surface of the substrate 300 has a rounded edge profile in region C, thereby suppressing formation of a tip on the substrate 300 adjacent the second channel trench 370. Additionally, the substrate 300 may be cleaned using an SC1 solution or a hydrogen fluoride (HF) solution.

Figure 15:
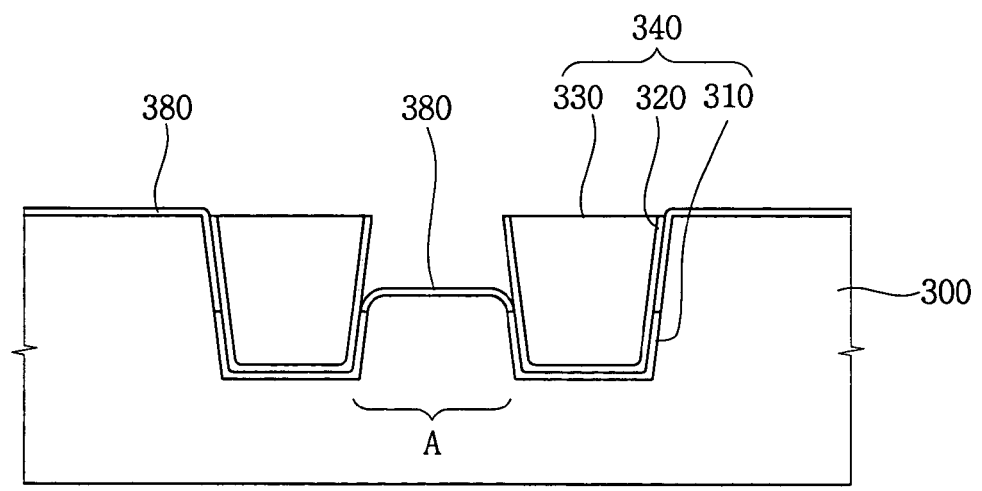

Referring to FIG. 15, a gate oxide layer 380 is then formed on the surface of the substrate 300. The gate oxide layer 380 may be formed by an oxidation process. For example, the substrate 300 is oxidized using an oxygen gas to form the gate oxide layer 380 thereon.

Figure 16:
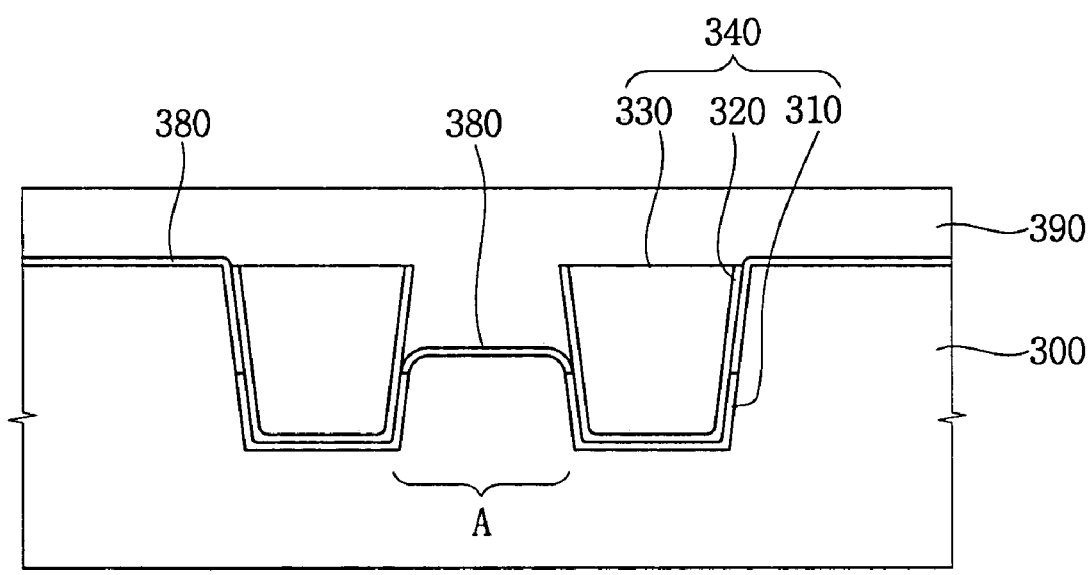

Referring to FIG. 16, a gate electrode layer 390 is formed on the gate oxide layer 380. The gate electrode 390 may include crystalline polysilicon.

EXAMPLE

Figure 17:
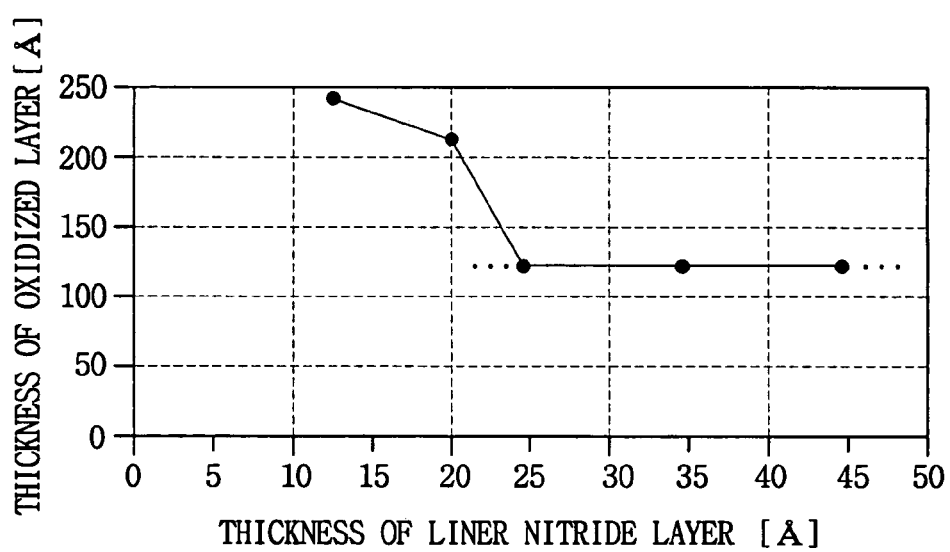
FIG. 17 is a graph showing an oxidation-resistance of a liner nitride layer.

FIG. 17 is a graph showing an oxidation-resistance of a liner nitride layer. In FIG. 17, the horizontal axis represents a thickness of a liner nitride layer and the longitudinal axis represents an oxidized thickness.

Oxide layers having a thickness of about 120 Å were formed on substrates, respectively. Liner nitride layers having different thickness were formed on the oxide layers, respectively. The substrates were oxidized using oxygen (O2), water vapor (H2O) and hydrogen chloride (HCl) at a temperature of about 900° C. to grow oxidized layers, after which the thickness of each of the resulting oxidized layers was measured.

As shown in FIG. 17, oxidized layers having different thickness grew on the substrates that include liner nitride layers having a thickness of less than about 25 Å. Whereas, the oxidized layers grew to a constant thickness of about 125 Å in the substrates that include liner nitride layers that had a thickness of greater than above about 25 Å. According to the above results, it could be noted that liner nitride layers having a thickness of at least about 25 Å are preferred for process consistency. As a result, it should be noted that liner nitride layers of between about 40 Å and about 60 Å may be used when forming the oxidized layer.

As described above, in the method of the present invention, the remaining portion of the substrate between the isolation trench and the channel trench is oxidized to form a portion of the oxide layer after which the oxide layer is removed by wet etching thereby preventing or suppressing tip formation on the substrate at the periphery of the channel trench. Accordingly, the channel trench has improved profile so that the consistency and/or reliability of the resulting semiconductor devices is enhanced.

Having described the preferred embodiments for forming the dielectric layers, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of manufacturing a semiconductor device comprising:

forming isolation trench structures in a substrate, the isolation trench structures having sidewalls that are inclined relative to a substrate surface;

providing a first channel trench and peripheral substrate regions by removing an upper portion of the substrate between adjacent isolation trench structures, the peripheral substrate regions being located adjacent the isolation trench structure sidewalls;

oxidizing the peripheral substrate regions substantially completely to form peripheral oxide regions adjacent the isolation trench structure sidewalls;

removing the peripheral oxide regions layer to form a second channel trench, wherein the isolation trench structures include a sidewall oxide layer pattern adjacent the peripheral substrate regions;

the second channel trench includes a substantially planar primary lower surface; and removing the peripheral oxide regions also removes a portion of the sidewall oxide layer pattern lying below a plane defined by the primary lower surface of the second channel trench.

2. A method of manufacturing a semiconductor device according to claim 1, wherein:

the lower surface of the second channel trench includes peripheral surface regions that are recessed relative to the plane defined by the primary lower surface of the second channel trench.

3. A method of manufacturing a semiconductor device according to claim 2, wherein:

the peripheral surface regions have a generally arcuate profile.

4. A method of manufacturing a semiconductor device according to claim 1, wherein:

oxidizing the peripheral substrate regions includes processing the substrate in an oxidation furnace.

5. A method of manufacturing a semiconductor device according to claim 4, wherein:

the peripheral substrate regions are oxidized at a temperature between about 800° C. and about 900° C.

6. A method of manufacturing a semiconductor device according to claim 5, wherein:

within the oxidation furnace the substrate is exposed to a gas mixture that includes at least two compounds from a group consisting of oxygen ($O_2$), water vapor ($H_2O$) and hydrogen chloride (HCl).

7. A method of manufacturing a semiconductor device according to claim 1, wherein:

removing the peripheral oxide regions layer to form a second channel trench includes immersing the substrate in a wet etch solution containing hydrogen fluoride (HF).

8. A method of manufacturing a semiconductor device according to claim 1, further comprising:
cleaning the substrate after removing the peripheral oxide regions, the cleaning including immersing the substrate in at least one solution selected from a group consisting of an SC1 solution or a hydrogen fluoride (HF) solution.

9. A method of manufacturing a semiconductor device according to claim 8, wherein:
forming a gate oxide on the primary surface of the second channel trench.

10. A method of manufacturing a semiconductor device comprising:
removing portions of a substrate to form isolation trenches;
forming an oxide layer on sidewalls and bottom faces of the isolation trenches;
forming a liner nitride layer on the oxide layer;
depositing an insulating layer on the liner nitride layer, the insulating layer having a thickness sufficient to fill the isolation trenches;
removing upper portions of the insulating layer, the liner nitride layer and the oxide layer to expose surface portions of the substrate and to form isolation trench structures;
forming a first channel trench by removing an upper portion of the substrate between adjacent isolation trench structures, the formation of the first channel trench leaving residual substrate regions adjacent the isolation trench structure;
oxidizing the residual substrate regions to form peripheral oxide regions, the oxidation consuming substantially all of the residual substrate regions;
removing the peripheral oxide regions to form a second channel trench having as a lower boundary a primary lower substrate surface;
forming a gate oxide layer on the primary lower substrate surface;
forming a gate electrode on the gate oxide layer; and
wherein removing the peripheral oxide regions includes removing a portion of the oxide layer lying below a plane defined by the primary lower substrate surface and forming a peripheral lower substrate surface adjacent to and recessed relative to the primary lower substrate surface.

11. A method of manufacturing a semiconductor device according to claim 10, wherein:
the peripheral oxide regions have a maximum thickness of less than about 150 Å.

12. A method of manufacturing a semiconductor device according to claim 11, wherein:
the peripheral oxide regions are formed in an oxidation furnace operating at a temperature of between about 800° C. and about 900° C.

13. A method of manufacturing a semiconductor device according to claim 12, wherein:
an oxidizing ambient is created within the oxidation furnace by exposing the substrate to at least two compounds from a group consisting of oxygen ($O_2$), water vapor ($H_2O$) and hydrogen chloride (HCl).

14. A method of manufacturing a semiconductor device according to claim 10, wherein:
removing the peripheral oxide regions includes exposing the substrate to a wet etching solution.

15. A method of manufacturing a semiconductor device according to claim 10, further comprising:
cleaning the substrate after removing the peripheral oxide regions and before forming the gate oxide, the cleaning including exposing the substrate to an SC1 solution or a hydrogen fluoride (HF) solution.

16. A method of manufacturing a semiconductor device according to claim 1, wherein:
the peripheral lower substrate surface has a generally curved profile.

* * * * *